United States Patent
Hartmann

(10) Patent No.: US 6,667,875 B1
(45) Date of Patent: Dec. 23, 2003

(54) PULSE GENERATOR FOR GENERATING A VOLTAGE PULSE AND CORRESPONDING METHOD

(76) Inventor: Werner Hartmann, Neue Str. 28, 91091 Grossenseebach (DE)

(*) Notice: Subject to any disclaimer, the term of this patent is extended or adjusted under 35 U.S.C. 154(b) by 0 days.

(21) Appl. No.: 09/806,345
(22) PCT Filed: Sep. 15, 1999
(86) PCT No.: PCT/DE99/02952
§ 371 (c)(1), (2), (4) Date: May 25, 2001
(87) PCT Pub. No.: WO00/19609
PCT Pub. Date: Apr. 6, 2000

(30) Foreign Application Priority Data

Sep. 29, 1998 (DE) .......................... 199 44 619

(51) Int. Cl.⁷ ............................................... H02M 3/00
(52) U.S. Cl. .......................................... 361/235; 363/68
(58) Field of Search .......................... 361/235; 363/68, 363/37

(56) References Cited

U.S. PATENT DOCUMENTS

| | | | | |
|---|---|---|---|---|
| 4,107,757 A | * | 8/1978 | Masuda et al. ............... | 361/235 |
| 4,296,358 A | * | 10/1981 | Bernier ......................... | 315/241 |
| 4,558,404 A | * | 12/1985 | James ........................... | 363/37 |
| 4,567,541 A | * | 1/1986 | Terai ............................ | 361/235 |
| 4,600,411 A | * | 7/1986 | Santamaria ................... | 55/139 |
| 4,698,719 A | | 10/1987 | Taarning | |
| 5,542,967 A | * | 8/1996 | Ponizovsky et al. ............ | 96/82 |

FOREIGN PATENT DOCUMENTS

| | | |
|---|---|---|
| DE | A1-2733145 | 2/1979 |
| DE | A1-3437953 | 4/1986 |
| DE | A1-4104386 | 9/1991 |
| DE | A1-4420832 | 1/1995 |
| DE | C1-19614195 | 6/1997 |
| EP | A1417771 | 3/1994 |
| EP | A2639885 | 2/1995 |
| EP | A1789445 | 8/1997 |
| GB | 1581763 | 12/1980 |

OTHER PUBLICATIONS

S. Ciarcia, Build a 5W DC to DC converter, BYTE, Oct. 1978, p. 22, 24, 26, 28 and 30–31.*
A.B. Williams, F.J. Taylor, Electronic Filter Design Handbook, McGraw–Hill, 1995, pp. 17.1–17.3*
General Electric Co., Silicon Controlled Rectifier Manual, 2dn Edition, 1961, pp. 79–85.*
Dinelli, IEE Colloquim, vol. 118, pp. 6/lff (1991).
Miller et al., Forschungsbericht FZKA–PEF 140 (1966).
Dinelli, Journal of Electrostatics, vol. 25, pp. 23–40 (1990).

* cited by examiner

Primary Examiner—Gregory J. Toatley, Jr.
Assistant Examiner—Z Kitov
(74) Attorney, Agent, or Firm—Harness, Dickey & Pierce, P.L.C.

(57) ABSTRACT

A pulse generator produces a voltage pulse for an inductive or capacitive load, in particular for an electrostatic dust extractor, having an energy-storage capacitor which is connected in series with a controllable switch. The switch is self-opening at the zero crossing of the current flowing to the load, in a series of tuned circuits. The energy-storage capacitor is discharged to the load by closing and opening the controllable switch in a single discharging process during only one half oscillation period of the series tuned circuit.

25 Claims, 5 Drawing Sheets

PULSE GENERATOR FOR GENERATING A VOLTAGE PULSE AND CORRESPONDING METHOD

This application is the national phase under 35 U.S.C. §371 of PCT International Application No. PCT/DE99/02952 which has an International filing date of Sep. 15, 1999, which designated the United States of America.

BACKGROUND OF THE INVENTION

The invention relates to a pulse generator for producing a voltage pulse for an essentially capacitive load, for use in an electrostatic dust extractor. Furthermore, the invention also relates to a method for producing a voltage pulse.

FIELD OF THE INVENTION

Electrostatic dust extractors (electrical filters) are used for retaining dust in fossil-fueled power stations and for numerous other industrial processes. For example, they are used in the paper, cement and metal-processing industries, in which dust extractors extract the dust contained in a gas flow charged by a strong electrical field. The dust is transported to an electrode, and is deposited there. Two problems, in particular, occur in this case, depending on the conductivity and distribution of the size of the dust particles:

i) Fine dust is often removed more poorly than coarse. Thus in the future, either complex downstream mechanical filters will be required, or existing filter systems will need to be retrofitted appropriately in order to comply with the increasingly more stringent legal requirements relating to dust emission limit values.

ii) Electrostatic charging of the already deposited dust layers frequently leads to flashovers, in which some of the deposited dust is released once again. In consequence, the efficiency of an electrical filter can be reduced considerably.

In order to avoid the abovementioned problems, it is known, for example from DE 196 14 195 C1, for electrostatic dust extractors to be used to which electrical high-power pulses are applied in order to increase the electrical field strength. This not only increases the amount of deposition, especially for fine dusts, but also reduces the charging of the deposited dust layers in the filter. In the past, comparatively long pulse durations of more than 50 µs up to several milliseconds have been used, owing to the technical limits of production of the necessary electrical high-power pulses. These can be produced, with adequate life, using commercial power semiconductors, which are already available.

It is also known, from J. Miller, A. Schwab, "Feinstaubabschaltung in betriebs-optimierten Elektrofiltern" [Fine-dust removal in operationally optimized electrical filters], Research Report FZKA-PEF 140, Karlsruhe University 1996, where the optimum pulse duration for use of this method is less than 10 µs for voltage amplitudes from a few tens of kilovolts up to 100 kV, depending on the type of dust extractor. The pulsed currents to be switched in this case are several kiloamperes. However, no standard commercially available components yet exist by means of which pulses such as these can be produced with the necessary life of up to 10 billion pulses (corresponding to fault-free operation for a period of 1 year with a pulse repetition rate of 300 Hz).

DE 196 14 195 C1 therefore proposes the use of a combination of semiconductor components which have a long life but whose load is comparatively low, with subsequent pulse compression by means of a magnetic switch. For this purpose, the magnetic switch is connected in series with a thyristor switch, with at least two high-voltage pulse capacitors being used for energy storing and pulse forming. Major problems that have been found with this circuit concept are the high operating voltage of up to 60 kV for the thyristor switch, and the necessary heat extraction from, and possibly limited life, of the magnetic switch. Another problem is the use of resistors, which contribute considerably to power losses in the overall system since only a portion of the energy stored in the capacitive load can be recovered.

The electrostatic principles of pulse generators are described in the Journal of Electrostatics, 25 (1990), pages 23 to 40. In particular, this states that a tuned circuit is normally used and that either high voltage pulses are produced directly or else low voltages are converted to high voltages by means of a transformer. Furthermore, DE 41 04 386 A1 specifically describes a pulse generator for use in electric fence appliances, in which a pulse transformer is used.

Finally, GB 1 581 763 A discloses a pulsed voltage source for applying a voltage pulse to a capacitive load, which pulsed voltage source contains a DC voltage source and a chargeable capacitor which is connected to the DC voltage source. A pulsed voltage of predetermined magnitude, and with a predetermined pause, can be produced by an appropriate circuit. In this document, the DC voltage across the load is decoupled from the pulsed voltage source by using a second high-voltage appliance which is connected in series with the pulsed voltage source and through which the entire pulse current flows while the high-voltage pulse is being produced. The need to cope with the pulse current in the high-voltage appliance on the load side and the fact that the pulsed voltage source is at the high-voltage potential represent additional technical requirements and, technically, can be satisfied only with major complexity.

SUMMARY OF THE INVENTION

Against the background of the prior art, the invention is based on the object of specifying a pulse generator for producing a voltage pulse, which avoids the disadvantages mentioned above and improves the efficiency of existing systems without any major changes to them. Furthermore, the invention is based on the object of specifying a method for producing a voltage pulse.

According to the invention, the first-mentioned object is achieved by the features of the main apparatus claim 1, for example, and the second-mentioned object is achieved by the features of the main method claim 11, for example. Developments are specified in the respective dependent claims, for example.

In the invention, the pulse generator contains an energy-storage capacitor which is connected in series with a controllable switch. The switch is self-opening at the zero crossing of the current flowing in the load, in a series of tuned circuits. A rectifier, for carrying the current flowing in the opposite direction to the load after the zero crossing, is connected in parallel with the switch. If the load is essentially capacitive, the capacitance of the energy-storage capacitor is greater than the capacitance of the load and is at least ten times the capacitance of the load. Further, at least a first DC power supply is provided in order to charge the energy-storage capacitor.

The invention defines, in particular, such an arrangement in which
- a pulse generator without a transformer is formed,
- the amplitude of the output pulse is greater than the voltage of the energy-storage capacitor,
- the recovery time of the switch is shorter than the period during which current flows in one current half-cycle,
- a rectifier which is connected in parallel with the switch is provided to carry the current which flows in the opposite direction to the load after the zero crossing,
- the energy-storage charge of the rectifier is small in comparison to the charge which is transferred to the load during the first current half-cycle, and
- the current through the switching element and the rectifier is essentially equal to the current in the load.

In the method as claimed in patent claim 11, for example, an energy-storage capacitor which is connected in a series of tuned circuits is discharged to the load. This is done by closing and opening a controllable switch in a single discharging process during only one half oscillation period of the series tuned circuit. Further, in a second current half-cycle which is slightly shorter, it is charged once again from the energy temporarily stored in the load.

The measures as claimed in patent claims 1 and 11 for example, allow short-voltage pulses with an amplitude of several tens of kilovolts and pulse durations of a few microseconds to be produced with a high pulse repetition rate of several hundred Hertz. This can be done by using electrical components which are already commercially available without any problems, and which require neither a magnetic switch, whose life and power losses are limited, nor resistors, which also create losses.

Such a pulse generator according to the invention and such a method according to the invention can also be used for extracting sulfur oxides and nitrogen oxides from the gases emitted by the power stations. High-voltage pulses with an amplitude of several tens of kilovolts, a pulse duration of a few microseconds and pulse currents of several kiloamperes are also required for this purpose. Recent works have shown that, provided an appropriate power pulse technology is available, such methods operate economically, as is stated, for example, in G. Dinelli, "An integrated approach for flue gas cleaning by impulse energization techniques", IEE Colloquium on "Current environmental applications of electrostatic precipitation", digest no. 118, p. 6/1 et seq., London, UK 1991.

In addition, the pulse generator according to the invention and the method according to the invention can also be used for other applications, subject to appropriate adaptation of the passive components to the required pulse parameters. For example, they can be used for pulse production for the purification of engine exhaust gases using pulsed discharges or for plasma immersion ion implantation.

Since a controllable switch is provided which is self-opening at the zero crossing of the current flowing to the load, the control electronics required for controlling the switch are considerably simplified, since only the closing of the switch need be triggered.

In a further preferred refinement of the invention, a rectifier connected in parallel with the switch is provided in order to carry the current flowing in the opposite direction to the load after the zero crossing. In consequence, the voltage across the load is reduced rapidly, and the overall pulse duration is limited. Furthermore, if the load is essentially capacitive, at least some of the charge which is discharged to a capacitive load can flow back to the energy-storage capacitor once again.

Further advantageous refinements of the invention result from the respective dependent claims, for example.

BRIEF DESCRIPTION OF THE DRAWINGS

In order to explain the invention further, reference is made to the exemplary embodiments in the drawing, in which.

DETAILED DESCRIPTION OF THE PREFERRED EMBODIMENTS

Figure 1:
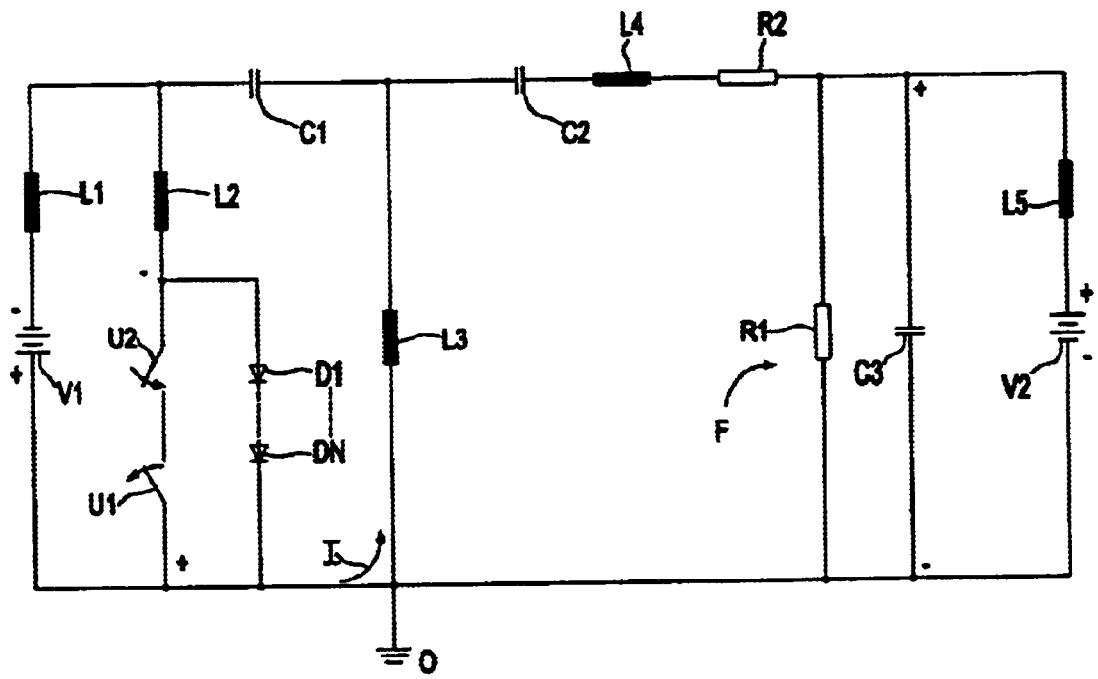
FIG. 1 shows a schematic circuit diagram of a pulse generator according to the invention.

According to FIG. 1, the pulse generator contains a series tuned circuit which includes an energy-storage capacitor C1 and coils L2 and L4 which are connected in series with it, and which each have an inductance of about 10 $\mu$H. A controllable switch U is connected in series with the series tuned circuit and, in order to illustrate its function symbolically, is represented by two series-connected switch elements U1 and U2. The switch element U2 is a make switch and the switch element U1 is a break switch, in which case both functions can also be integrated in single electronic components (active semiconductor device), such as a thyristor, an IGBT or a GTO, for example. In the practical embodiment, the switch U is formed from a circuit which, in each case, contains a number of controllable active semiconductor devices in order to cope with the switching powers required in the respective application. The switch U can also be in the form of a gas-discharge switch, for example a thyratron, which does not conduct in the reverse direction.

The capacitance of the energy-storage capacitor C1 is greater than the capacitance of the load C3. In particular, it is more than three times the capacitance of the load C3, and preferably more than ten times said capacitance. In the exemplary embodiment, the energy-storage capacitor C1 has a capacitance of about 1 $\mu$F and is charged to a DC voltage of about 25 kV to 30 kV from a first DC power supply V1 via inductors L1 and L3, which each have an inductance of 40 mH in the exemplary embodiment. In this case, the output-side connection of the energy-storage capacitor C1 is maintained at ground potential during the charging process via the high-inductance inductor L3.

In the equivalent circuit, an electrical dust extractor F is characterized electrically by a capacitive load C3 and a resistor R1, which takes account of the corona current through the dust extractor F. The dust extractor F is typically operated at a high-voltage potential of about 50 kV by means of a second DC power supply V2.

An isolating capacitor C2 is connected in a supply line to the electrostatic dust extractor F and has the task of keeping the basic or filter voltage produced by the second DC power supply V2 away from the first DC power supply V1, which produces the pulses.

The coil L4 and a resistor R2 connected in series with it, in practice of about 0.1Ω, essentially represent the inductance and the resistance of the supply line from the energy-storage capacitor C1 to the dust extractor F.

A voltage pulse is now produced across the capacitive load C3 by closing the switch U, that is to say by closing the switch element U1 when the switch element U2 is closed. That side of the energy-storage capacitor C1 which has been charged to the negative high-voltage potential is in consequence drawn to ground potential. For charge-maintenance reasons, this results in the outward-side, or L3-side connection of the energy-storage capacitor C1, being arranged to an equal positive potential. The charge pulse produced in this way oscillates via the L4, C2 and R2 into the capacitive load C3 where it leads to a pulsed voltage increase. In other words, once the switch U has been closed, a current I flows from the energy-storage capacitor C1 to the capacitive load C3, and charges it.

If the capacitance of the energy-storage capacitor C1 is chosen to be very much greater than the capacitance of the capacitive load C3, the charge maintenance results in the amplitude of the voltage pulse across the capacitive load C3 being approximately twice the charge voltage of the energy-storage capacitor C1; with the relationship $U_{C3}=2*V1*C1/(C1+C3)$ being satisfied approximately, that is to say ignoring losses.

In the dust extractor F, a portion of the charge from the energy-storage capacitor C1 is used, in the form of a corona discharge, for charging and for dust extraction. This is represented in the equivalent circuit by the resistor R1 connected in parallel with the capacitive load C3. In order to obtain a short overall pulse duration across the capacitive load C3, the charge which is not consumed in the corona discharge must be dissipated rapidly once again. In this case, the charge which remains on the capacitive load C3 should be able to flow back with as little loss as possible into the energy-storage capacitor C1, in order in this way to minimize the overall losses, particularly at high pulse repetition rates. When using a switch U which is self-opening at the current zero crossing, for example a thyristor circuit, and in particular a series circuit formed by a number of thyristors, this is made possible by means of a rectifier connected in parallel with the switch U but in the opposite direction, in the example N series-connected high-speed high-voltage diodes or high-voltage rectifiers D1, . . . , DN (diode chain). If an electronic switch which is not self-opening (self-extinguishing) is used, for example a circuit formed by IGBTs, from back-to-back parallel connected thyristors or from GTO thyristors, a control signal which causes quenching must be supplied at the desired opening time.

After completion of the charge-reversal process from the energy-storage capacitor C1 to the capacitive load C3, the thyristors used for the switch U in the exemplary embodiment see a current zero crossing and themselves start to block the current flow, so that the diode chain (D1, . . . DN) has to take over the reverse charge flow. The diode chain D1, . . . DN thus prevents the simultaneous occurrence of damaging negative voltage pulses on the switch U, by limiting them to the values which are appropriate for the forward voltage drop of the diode chain D1, . . . DN.

The process of discharging the energy-storage capacitor C1 is thus limited to a time period of half the oscillation period of the series tuned circuit, in order to prevent the series tuned circuit from oscillating. If active semiconductor devices which are not self-opening but conduct the current flow in both directions are used for the controllable switch U, then the process of discharging the energy-storage capacitor C1 can also be limited to a time period which is shorter than half the period of the oscillation. In addition, a switch U formed from such active semiconductor devices can, by appropriate control (closing) of the active semiconductor devices in the next half period, also carry the current while the capacitive load C3 is being discharged or, in general, during the reduction in the voltage across the load. Thus, there is no need for a parallel-connected rectifier. The advantage of using a combination of a thyristor circuit with a rectifier is thus essentially the simplicity of the control electronics required for this purpose since, apart from a trigger pulse for the start of the discharging process, no further control signals are required.

Figure 2:
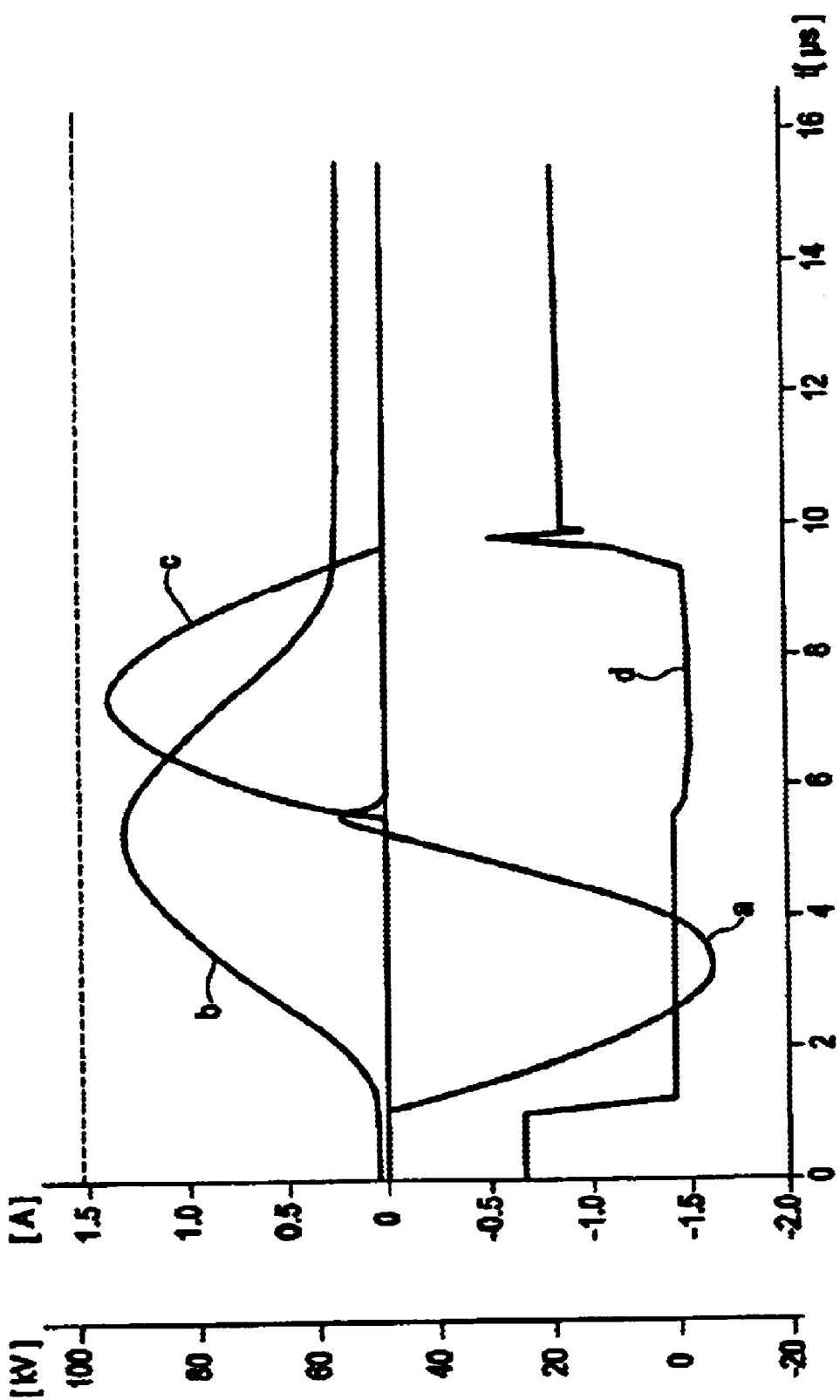
FIG. 2 shows a diagram in which, in order to illustrate the method of operation of the pulse generator, the current flowing through the controllable switch, the applied voltage, the voltage across the load and the current flowing back from the load to the energy-storage capacitor are plotted against time.

FIG. 2 shows the method of operation of the pulse generator on the basis of the current and voltage signals which occur. Once the switch U has closed, a current I (switch or charging current I1) starts to flow through the switch U (switch current, curve a). At the same time, the voltage across the capacitive load C3 (filter voltage, curve b) rises and, after about 4 $\mu$s, reaches a maximum of about 43 kV above the applied basic voltage at 50 kV, that is to say a total voltage of 93 kV. The switch U starts to switch off from the time of the current zero crossing in the switch U, and the switch current I1 (charging current) falls to zero. However, in the opposite direction, the diodes in the diode chain D1, . . . , DN are forward-biased and carry the charge from the capacitive load C3 back to the energy-storage capacitor C1 (diode, curve c). The current I thus flows as a discharge or diode current I2 in the opposite direction to the charging current I1. Accordingly, the voltage across the capacitive load C3 also very rapidly falls back to approximately the basic voltage once again. This thus results in a voltage pulse across the dust extractor F with an amplitude of approximately 43 kV, and a half-level width of approximately 4.5 $\mu$s. The diagram also shows the voltage drop across the switch U (switch voltage, curve d). When the switch U is completely closed, this is virtually equal to zero and, when the switch U is opened, falls to a negative value which corresponds to the forward voltage drop of the diode chain D1, . . . , DN.

The pulse duration can be varied within wide limits from about 1 $\mu$s to several tens of microseconds by suitable selection of the passive components, in particular C1, C2, L2 and L4. The choice of the ratio of C1 to C3 governs both the ratio of the pulse amplitude to the charge voltage C1 and the energy stored in C1. The chosen ratio of C1/C3=10 results in a ratio of $U_{C3}/U_{C1}=1.72$ taking account of the attenuation due to losses in R2. (The expected value without attenuation would be 1.82).

Figure 3:
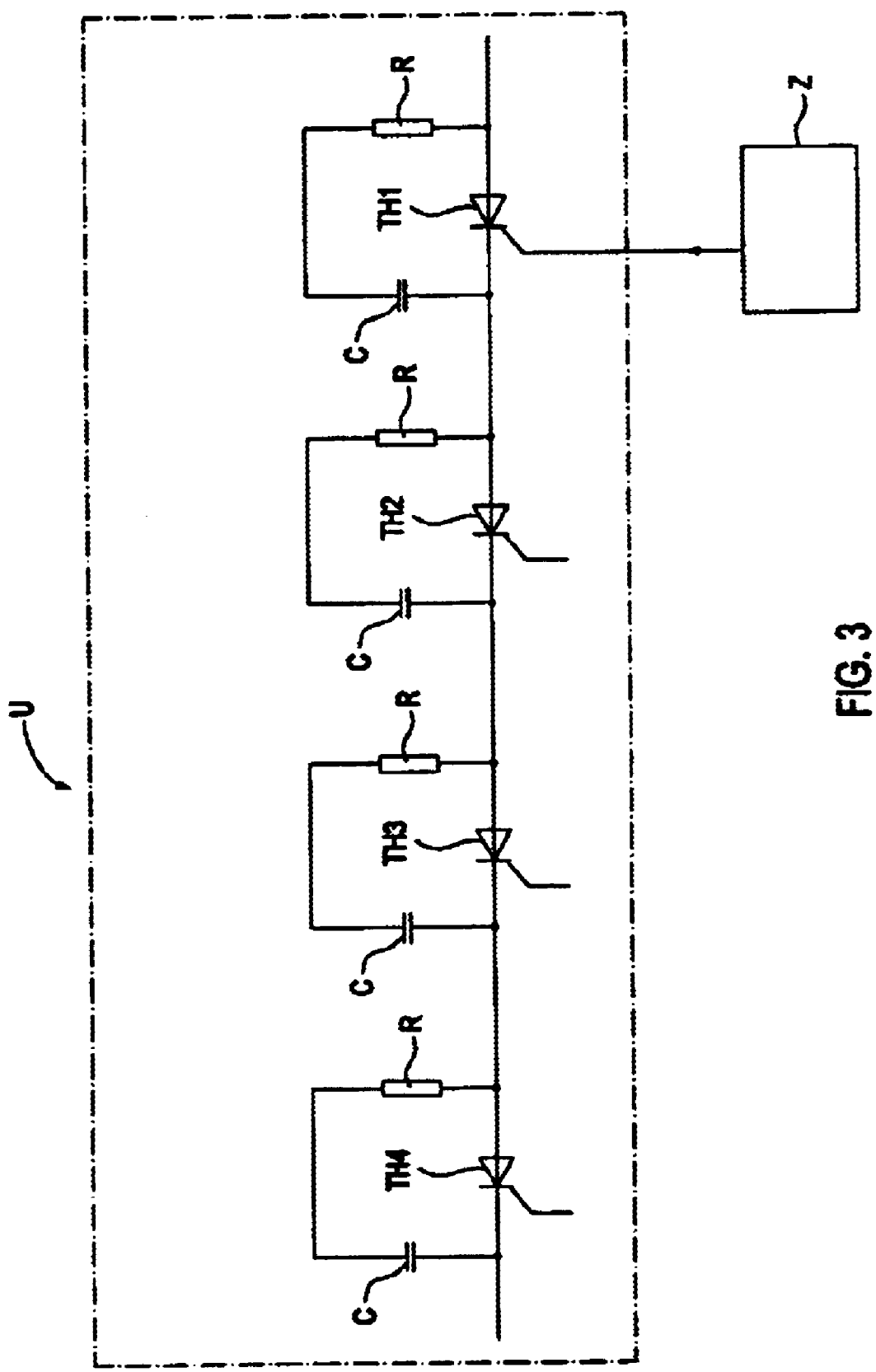
FIG. 3 shows an exemplary embodiment of the controllable switch with a number of series-connected thyristors.
Figure 3A:
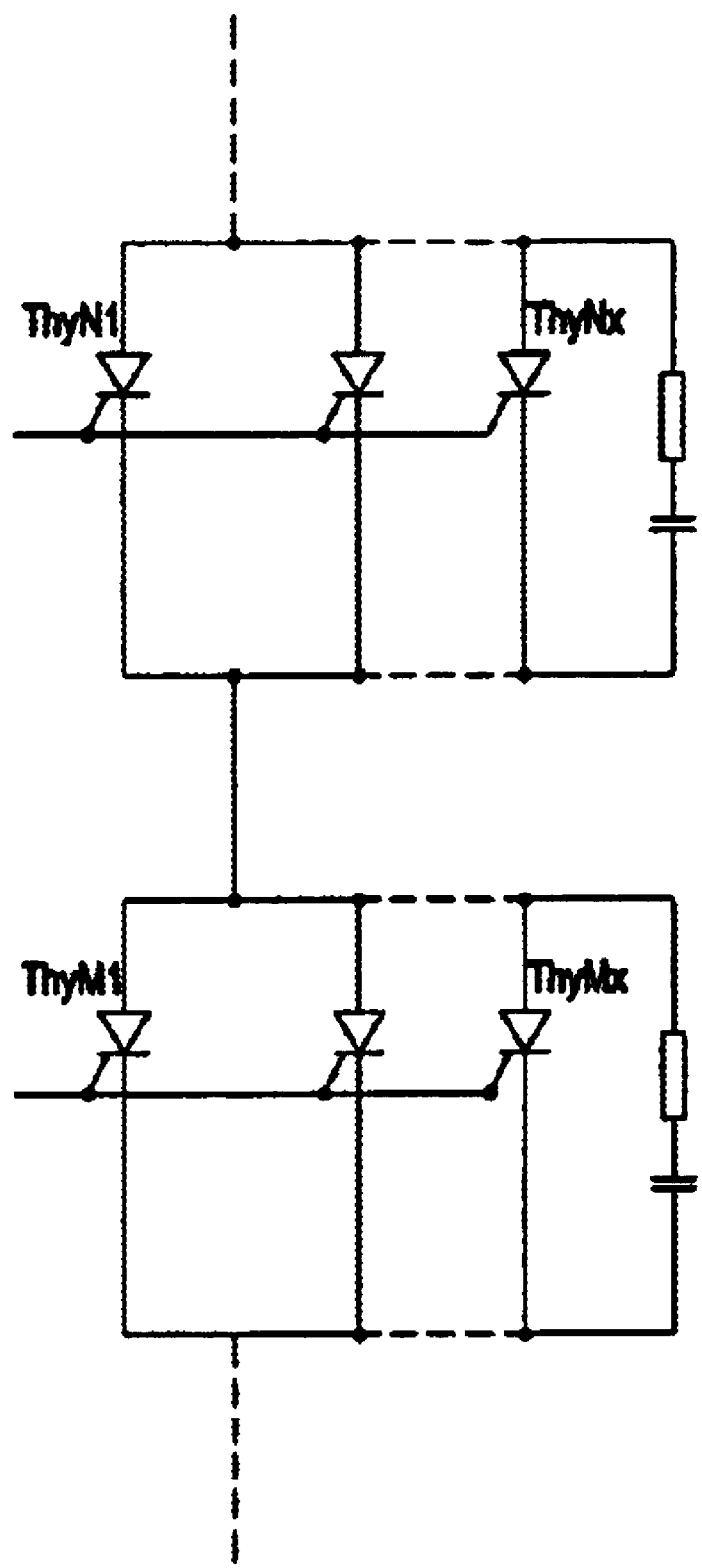
FIG. 3a shows an exemplary embodiment thyristors connected in parallel.

The chosen form of the voltage doubling circuit allows high-voltage pulses to be produced with amplitudes of approximately 40 kV with the voltages that need to be switched being only about 25 kV. High-voltage-resistant thyristors can thus be used for the switch U. If, for example, light-triggerable thyristors TH1, . . . , TH4 with a reverse voltage of more than 7 kV are used (for example EUPEC Type T1503N75T, [4]), according to FIG. 3, a stack size of only 4 series-connected thyristors TH1, . . . , TH4 is sufficient to achieve an adequate overall reverse voltage for the switch U, without exceeding the maximum rate of current rise of 2 kA/$\mu$s for these thyristors TH1, . . . , TH4. The light triggering capability furthermore makes it possible to use a floating drive via optical waveguides, so that the circuit complexity for triggering the thyristors TH1, ..., TH4 is reduced considerably and the operational response is considerably more reliable than when a number of series-connected thyristors TH1, ..., TH4 are triggered electrically.

The control process can be simplified in a particularly advantageous manner by exploiting what is referred to as the overhead triggering capability of the light-triggerable thyristors TH1, ..., TH4. In this case, only one of the series-connected thyristors TH1, ..., TH4, for example the thyristor TH1 need be triggered using a trigger control Z. When this thyristor TH1 switches on, then the voltage which is applied to the thyristor stack TH1, ..., TH4 is shared between the remaining thyristors TH2, ..., TH4, which are still switched off. As soon as the voltage across the remaining thyristors TH2, ..., TH4 exceeds the respective overhead withstand voltage of the individual thyristors TH2, ..., TH4, these thyristors TH2, ..., TH4 are also switched on without active triggering, so that the entire thyristor stack is switched on and initiates the pulse production process within a short time.

Furthermore, each thyristor TH1, ..., TH4 has associated protective circuitry against radio-frequency voltage spikes, which circuitry includes the capacitors C and the resistors R. In one particularly advantageous circuit, metal-oxide varistors are used for the resistors R and protect the thyristors TH1, ..., TH4 against unacceptable overvoltages.

Figure 4:
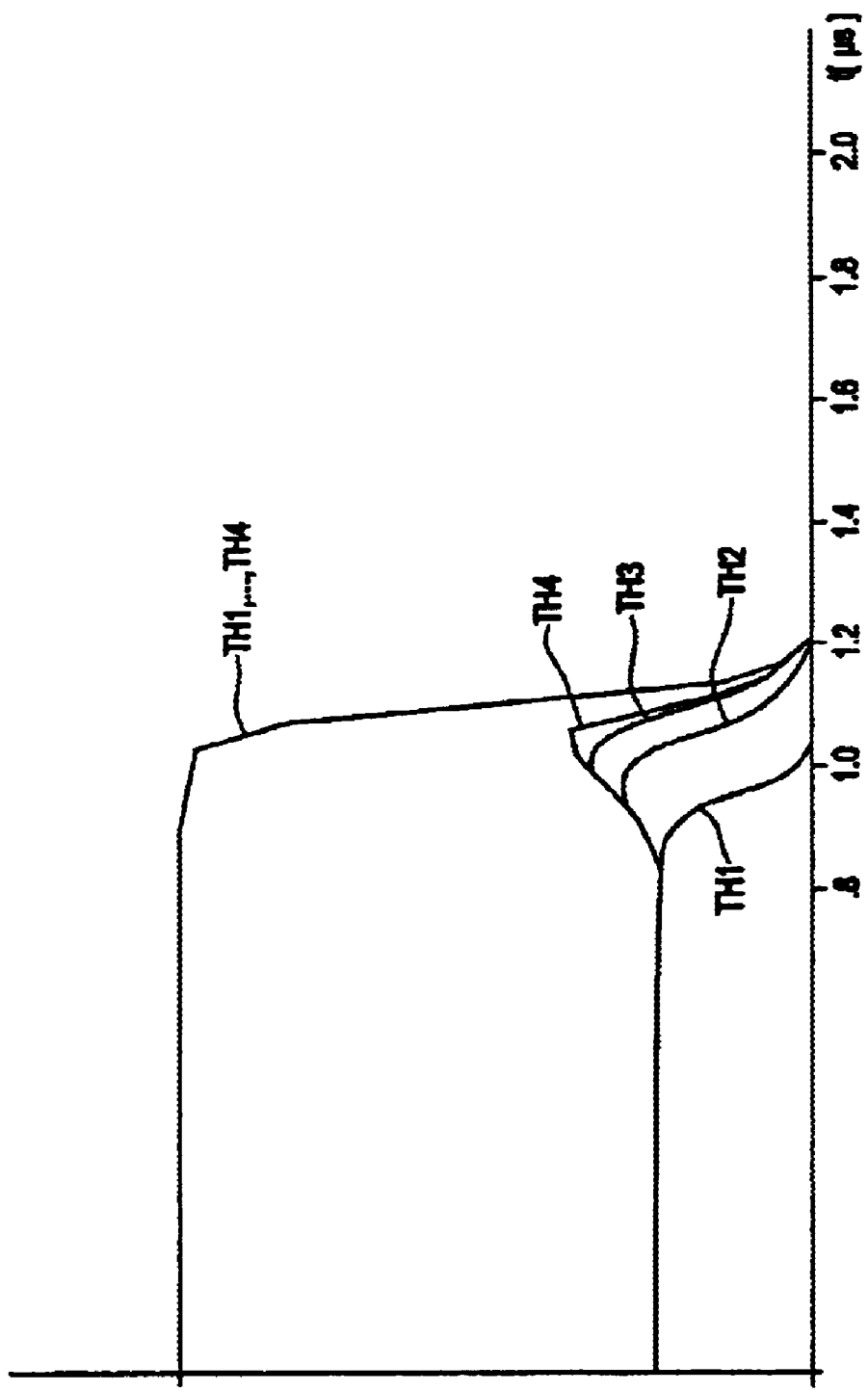
FIG. 4 shows a diagram in which the voltages which result across the thyristors in the preferred mode of operation of the circuit shown in FIG. 3 are plotted against time.

FIG. 4 shows the switching response of such a thyristor stack TH1, ..., TH4, in which the first thyristor TH1 (triggered thyristor TH1) is triggered electrically or optically via an optical waveguide. The overvoltages which are applied to the further thyristors TH2, ..., TH4 (overvolted thyristors, TH2, TH3, TH4) switch them on with a slight delay so that, in the end, the overall voltage across the thyristor stack TH1, ..., TH4 (total stack voltage, TH1, ..., TH4) collapses. For illustrative purposes, it has been assumed in this example that the overhead-triggered thyristors trigger at somewhat different voltages.

An increase in the current capacity and in the rate of current rise can also be achieved by replacing each of the thyristors TH1, ..., TH4 from FIG. 4 by a thyristor circuit which, for its part, includes a parallel circuit formed by two or more individual thyristors.

Other overhead-triggerable active devices, for example diodes with an avalanche breakdown characteristic, can also be used instead of the thyristors TH2, ..., TH4.

Figure 5:
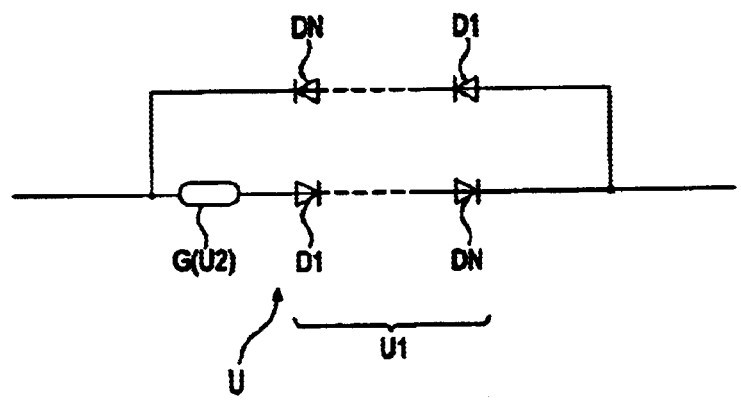
FIG. 5 shows a further advantageous embodiment of a controllable switch which is suitable for use in the pulse generator.

Some applications require such high voltages, currents and rate of current rise that the maximum permissible parameter ranges of the available thyristors are exceeded to a major extent. In this situation, a combination of available individual thyristors connected in series and parallel is often not economically viable and, furthermore, cannot reliably be accepted technically. In this situation, it is advantageous to replace the make function of the switch element U2 shown in FIG. 5 by a gas-discharge switch G, which satisfies the required parameters. The break function required for the switch U1 in the opposite current direction is in this case satisfied by an appropriately designed rectifier D1', ..., DN' connected in series with the gas-discharge switch G and constructed analogously to the diode chain D1, ..., DN.

Since, in the phase in which the diode chain D1', ..., DN' is carrying the current, no current is flying through the gas-discharge switch G, it has until the end of this phase to recover its withstand voltage and then once again to withstand the high voltage which is once again applied to the energy-storage capacitor C1. This circuit variant is feasible since it is technically simpler to manufacture high-voltage-resistance semiconductor diodes with short switching times and a high current load capacity than is the case with thyristors.

Switches which are particularly suitable for this variant are hydrogen-filled triggerable gas-discharge switches, especially in the low-pressure range, such as thyratrons, pseudo-spark switches, crossatrons, triggered vacuum spark gaps, and high-speed hydrogen-filled pressurized spark gaps. One common feature of these switches is that their withstand voltage recovers particularly quickly once a switching process has been carried out. This property is necessary to ensure that the switch recovers its forward stand voltage during the short phase, typically of a few microseconds, in which the diode chain D1, ..., DN is forward-biased.

The described circuit for pulse shaping is particularly suitable for use with a highly or predominantly capacitive load. Optimization for inductive loads is also feasible by appropriate selection of the parameters of the passive components. It is particularly advantageous in this case that the electrical energy which is not consumed in the load can be passed back virtually without any losses to the energy-storage capacitor C1, at a comparatively low voltage level and with a minimal number of components. Resistors and magnetic switches (which always create losses) can be completely dispensed with in this circuit, as a result of which the efficiency is extremely high. This circuit is thus particularly suitable for producing high-voltage pulses with a high pulse repetition rate, that is to say for applications with a high mean total power.

For the invention described with reference to the individual examples, it can be accepted that no semiconductor switching elements with an adequate recovery time exist. The specific combination of a high-speed switching element and a parallel high-speed rectifier allows the switching element to recover during the second current half-cycle. The switching element thus becomes free, since the rectifier takes over the current flow and thus relieves the load on the switching element, by which means the recovery time is defined here. However, the desired function is achieved only when, firstly, the switching element has a recovery time which is shorter than the duration of one current half-cycle and, secondly, the rectifier has an energy-storage charge which is small in comparison to the charge transferred to C3.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A pulse generator for producing a voltage pulse at a capacitive load, comprising:

a) a separate energy storage capacitor;

b) a self-opening, controllable switch;

c) a freewheeling circuit including at least one diode, connected in parallel with the controllable switch;

d) a first charging circuit being connected in series with the energy storage, a capacitor and at least an inductance;

e) a high voltage decoupling capacitor being connected in series with the load;

f) a second charging circuit being connected in parallel with the load, whereby the pulse generator and the second charging circuit are capacitively isolated by way of the high-voltage decoupling capacitor;

wherein in combination:

g) the energy storage capacitor is larger than the load capacitor;

h) and the self-opening switch is parallel with the capacitive load, whereby the overall efficiency is enhanced despite the capacitance mismatch between the energy storage capacitor and the load capacitor.

2. A method for producing a voltage pulse at a capacitive load using a pulse generator as claimed in claim 1, wherein the efficiency of the pulse forming circuit is improved, and the voltage requirements on the controllable switch are reduced, wherein an energy storage capacitor is used which is larger than the load capacitor;

the energy storage capacitor, connected in a series tuned circuit, is discharged into the load by closing the controllable switch in a single discharging process during only one half of an oscillation period of the series tuned circuit;

at least some of the energy stored in the load capacitor is recovered by feeding it back to the energy storage capacitor via a rectifier connected in parallel with the switch.

3. The pulse generator of claim 1, wherein the pulse generator is for producing a voltage pulse for an electrostatic dust extractor.

4. The method as claimed in claim 2, wherein a basic voltage is applied to the load.

5. The method as claimed in claim 2, wherein the controllable switch includes a gas-discharge switch connected in series with a rectifier.

6. The method as claimed in claim 2, wherein the controllable switch includes a thyristor circuit.

7. The method of claim 2, wherein a magnitude of a voltage pulse across the load is set by selection of a ratio of a capacitance of the energy-storage capacitor to a capacitance of the load.

8. The method as claimed in claim 5, wherein the rectifier includes a plurality of series-connected diodes.

9. The method as claimed in claim 2, wherein the controllable switch is self-opening at a zero crossing of the current.

10. The method as claimed in claim 6, wherein at least one thyristor in the thyristor circuit is triggered optically.

11. The method as claimed in claim 6, wherein the thyristor circuit includes a plurality of series-connected thyristor units, with each thyristor unit including at least one of an individual thyristor and a plurality of parallel-connected thyristors.

12. The method as claimed in claim 11, wherein only one of the series-connected thyristor units is triggered.

13. The method as claimed in claim 6, wherein the thyristor circuit includes a plurality of series-connected thyristor units, with each thyristor unit including at least one of an individual thyristor and a plurality of parallel-connected thyristors.

14. The pulse generator as claimed in claim 1, wherein the controllable switch includes a series circuit, including a gas-discharge switch and a rectifier.

15. The pulse generator as claimed in claim 1, wherein the energy-storage capacitor is at least ten times as large as the load capacitor.

16. The pulse generator as claimed in claim 1, wherein:

a pulse generator without a transformer is formed, and a recovery time of the switch is relatively shorter than a period during which current flows in one current half-cycle, the phase generator further comprising:

a rectifier, connected in parallel with the switch, to carry current which flows in a direction opposite to the load after the zero crossing, wherein an energy-storage charge of the rectifier is relatively small in comparison to a charge which is transferred to the load during a first current half-cycle.

17. The pulse generator as claimed in claim 16, wherein a forward voltage drop of the rectifier is less than a forward voltage drop of the switch.

18. The pulse generator as claimed in claim 1, wherein the diode forms a rectifier, containing an active semiconductor arrangement including a plurality of series-connected diodes.

19. The pulse generator as claimed in claim 1, wherein the controllable switch includes a thyristor circuit.

20. The pulse generator as claimed in claim 19, wherein the thyristor circuit includes optically triggerable thyristors.

21. The pulse generator as claimed in claim 19, wherein the thyristor circuit includes a plurality of series-connected thyristor units, with each thyristor unit including at least one of an individual thyristor and a plurality of parallel-connected thyristors.

22. The pulse generator as claimed in claim 21, wherein only one of the series-connected thyristor units is connected to a trigger control.

23. The pulse generator as claimed in claim 18, wherein the controllable switch includes a thyristor circuit.

24. The pulse generator as claimed in claim 23, wherein the thyristor circuit includes optically triggerable thyristors.

25. The pulse generator as claimed in claim 24, wherein the thyristor circuit includes a plurality of series-connected thyristor units, with each thyristor unit including at least one of an individual thyristor and a plurality of parallel-connected thyristors.

* * * * *